United States Patent [19]

Brown, Jr.

[11] 4,401,999
[45] Aug. 30, 1983

[54] ELECTROSTATIC HIGH VOLTAGE DRIVE CIRCUIT USING DIODES

[75] Inventor: Arling D. Brown, Jr., Cleveland Heights, Ohio

[73] Assignee: Gould Inc., Rolling Meadows, Ill.

[21] Appl. No.: 204,494

[22] Filed: Nov. 6, 1980

[51] Int. Cl.³ ............................................ G01D 15/06
[52] U.S. Cl. .................................................. 346/154
[58] Field of Search ............................ 346/153.1, 154; 307/246, 259, 280, 281, 319; 320/1; 340/166 R

[56] References Cited

U.S. PATENT DOCUMENTS

| | | | |
|---|---|---|---|
| 3,483,566 | 12/1969 | Rothgordt | 346/74 |
| 3,532,959 | 10/1970 | Erickson | 320/1 |
| 3,569,983 | 3/1971 | Marshall | 346/74 |
| 3,821,627 | 6/1974 | Milovancevic | 321/2 |
| 4,058,814 | 11/1977 | Brown, Jr. | 346/154 |
| 4,115,763 | 9/1978 | Brown, Jr. | 340/166 R |

OTHER PUBLICATIONS

National Bureau of Standards Technical News Bulletin, Oct. 1954, entitled "Diode Amplifier", pp. 145-148.
Radio-Electronic Engineering, Jan. 1955, entitled "Diode Amplifier" by A. W. Holt, pp. 18-21.
IRE Transactions on Electron Devices, Jul. 1959, entitled "Semiconductor Diode Amplifiers and Pulse Modulators" by W. H. Ko and F. E. Brammer, pp. 341-347.
IRE Transactions on Electron Devices, Mar. 1961, entitled "The Reverse Transient Behavior of Semiconductor Junction Diodes" by W. H. Ko, pp. 123-131.

*Primary Examiner*—Thomas H. Tarcza
*Attorney, Agent, or Firm*—John R. Garrett

[57] ABSTRACT

A diode switching system for use with an electrographic writing system is disclosed. The switching system has a high storage charge diode with a capacitor connected to its anode which defines an output. Once the diode is charged, application of a large drive voltage to the free end of the capacitor will short the voltage through the diode due to the stored charge of the diode, thus preventing the stylus from writing. When the diode has not been charged, application of a large drive voltage will be coupled through the capacitor thus powering the writing stylus.

12 Claims, 3 Drawing Figures

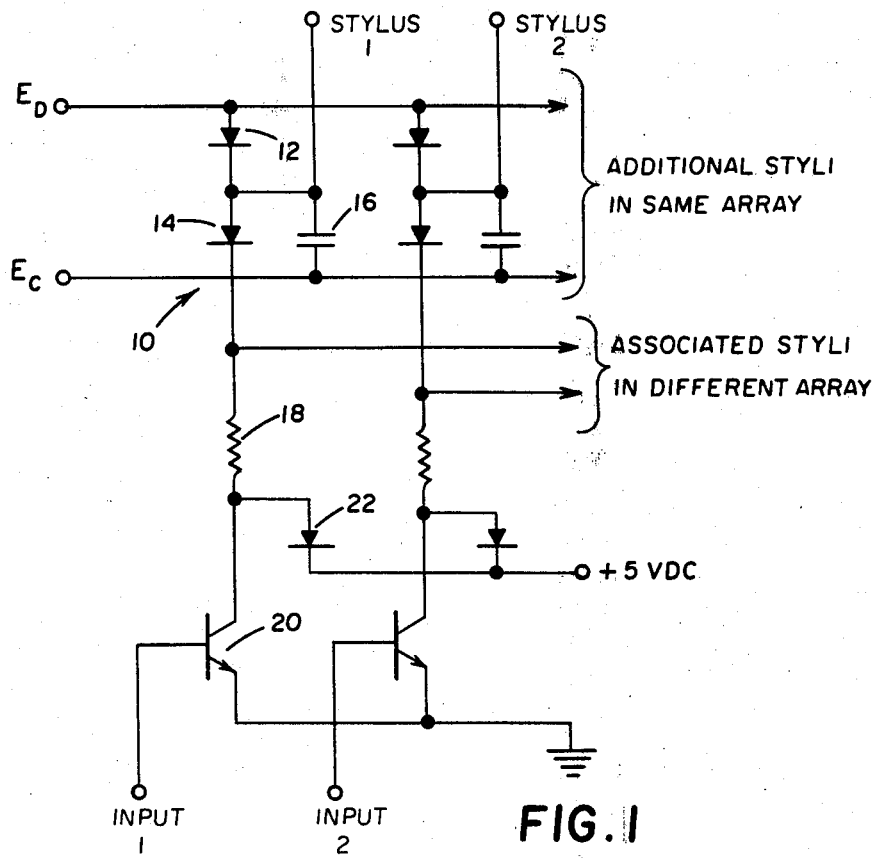
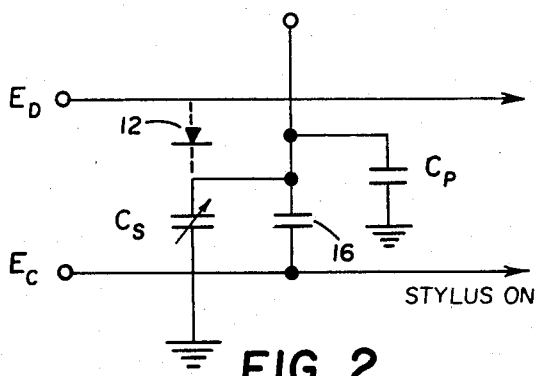
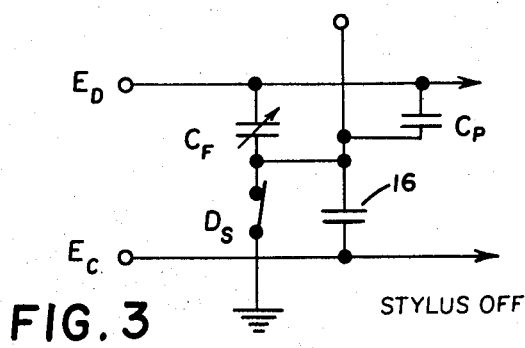

ELECTROSTATIC HIGH VOLTAGE DRIVE CIRCUIT USING DIODES

BACKGROUND OF THE INVENTION

This invention relates to electrographic recording systems. Voltages are impressed on record electrodes or styli as desired and an electrographic recording media in the proximity of the electrode is electrostatically charged to form a latent image. Toner is subsequently applied to the record medium to develop the image. The improvement described herein relates to circuitry for impressing a voltage on the record electrodes.

An electrographic writing system may have thousands of styli which must have a voltage impressed thereon quickly, effectively, and economically. Many different types of electrographic recording systems have been devised. For example, U.S. Pat. No. 3,662,396 incorporated herein by reference, discloses an electrographic recording system of the type utilizing coated paper as the record medium. A first array of recording electrodes is mounted in close proximity to the exposed surface of the charge retentive layer of the record medium. A second array of complementary electrodes is mounted adjacent to the first array in cooperative relationship in the record medium. A circuit is used to apply a first voltage of one polarity to the first array and a second voltage of opposite polarity to a second array of complementary electrodes. The second voltage thereby causes the potential of the conductive layer to change in coincidence with the first voltage.

Dual electrode systems have a relatively short write time. A single system is desirable to increase the time available for writing, reduce size, complexity and cost. Individual electrical drives for each stylus would impress voltages on the styli quickly, but are economically unfeasible for the large number of styli involved. Prior art devices have suggested the use of a plurality of high voltage switching transistors for each stylus. The quality and expense demanded by a plurality of switching transistors for each stylus also makes the possiblity undesirable.

One method of alleviating the above mentioned problems is disclosed in U.S. Pat. No. 4,115,763 and U.S. Pat. No. 4,058,814, both to Brown et al and assigned to the same assignee as the present invention and are incorporated herein by reference. The Brown et al patents show a switching system that uses a first high stored charge or slow diode and a second low stored charge or fast diode in series with a capacitor. When a stylus is desired to be powered the slow diode is set up with an initial forward biasing. A large negative voltage is then applied to the anode side of the slow diode in order to reverse bias it. Reverse current is then drawn through the slow diode for a short period of time which is sufficiently large to power the stylus for writing purposes.

A need has been felt to develop a different switching system using slow and fast diodes than what was taught in the aforementioned Brown et al patents.

OBJECTS OF THE INVENTION

An object of the present invention is to provide an electrical switching system for use with electrographic recording devices.

Another object of the present invention is to provide a switching system that will increase safety to the unit itself and to any operator over previous devices.

Yet another object of the present invention is to provide a high quality inexpensive switching system for an electrographic recording head.

The above objects are given by way of example. Thus other desirable objectives and advantages achieved by the invention may occur to those skilled in the art. The scope of the invention is to be limited only by the appended claims.

BRIEF SUMMARY OF THE INVENTION

The above objects and other advantages are achieved by the present invention. An electrical switching system is provided for use with electrostatic recording systems for writing on a record medium having a charge retentive surface and a conductive layer. An electrographic writing head includes a plurality of styli operatively connected to a switching system which includes at least one high stored charge diode for each stylus. When the high stored charge diode has not been conducting, the reverse drive voltage will be coupled through a capacitor to drive the stylus to a voltage sufficient to permit imaging of the record medium. When the slow diode has been set up, the stored charge in the slow diode shorts the output voltage within a few volts of ground in order to prevent the stylus from writing.

BRIEF DESCRIPTION OF THE DRAWINGS

FIG. 1 is a schematic diagram of a partial diode switching assembly;

FIG. 2 is a circuit equivalency representation of the switching circuit of FIG. 1 for the stylus on mode; and FIG. 3 is a circuit equivalency representation of the switching circuit of FIG. 1 for the stylus off mode.

DESCRIPTION OF THE PREFERRED EMBODIMENTS

A description of the invention follows, referring to the drawings in which like reference numerals denote like elements of structure in each of the several Figures.

A first low stored charge or fast diode 12 is provided which has a charge of about 5 nanocoulombs or less when the diode is foward biased or set up. A second high stored charge or slow diode 14 is provided which has a charge of about 25 to 80 nanocoulombs when the diode is forward biased or set up. It is preferred that the two diodes have a difference in stored charge of 20 nanocoulombs or more. The anode side of the slow diode is connected to the cathode side of the fast diode. A capacitor 16 is provided and has one side thereof connected to the junction of the slow diode 14 and the fast diode 10. This junction defines an output and is operatively connected to the stylus for application of the subsequent reverse drive voltage thereto. A resistor 18 is connected to the cathode side of slow diode 14. The other end of resistor 18 is connected to a switching device 20, preferably a transistor. Diode 22 is provided as a protection means for the switching device 20. Two drive voltages are provided; $E_D$ represents the diode drive voltage and $E_C$ represents the capacitor drive voltage. The operation and function of these two drive voltages will be discussed infra. The basic diode switching circuit thus described is incorporated into an electrographic writing system of the type and in the same manner as described in U.S. Pat. Nos. 4,058,814 and 4,115,763 which were fully incorporated herein supra. Each diode assembly within the writing system is divided into arrays, each array of diode assemblies having individual drive voltages $E_D$ and $E_C$ but the associated diode switching circuit in a different array shares corresponding switching devices 20. The operation of the diode switching circuit can be better appreciated by considering the circuit equivalents of FIGS. 2 and 3.

A forward bias is impressed across fast diode 12 and slow diode 14 for the purpose of setting up the diodes, i.e. for establishing an initial charge state therein. In order to accomplish this forward bias, $E_D$ is forced positive to preferably 5 volts D.C. It will typically take at least 10 microseconds in order to establish stored charge set up. In order to get current to flow in a forward bias direction, transistor 20 must be "ON" which means if transistor 20 is a NPN transistor, the input is sufficiently positive to permit current flow, preferably 10 ma when resistor 18 is 390 OHMS. When transistor switching device 20 is conducting, this defines a "stylus off" state in which no writing or powering of the stylus will occur, FIG. 3.

In FIG. 2, $C_S$ represents the variable capacitance of the slow diode 14 in the reverse voltage direction and $C_P$ represents the parasitic capacitance caused by wiring which is connected to ground under the worst case conditions. To ensure the stylus being clamped to the diode drive voltage $E_D$, the charge on $C_S$ and $C_P$ must be supplied by the capacitance drive voltage $E_C$. $E_C$ must be sufficiently more negative than $E_D$ to create an equal charge on capacitor 16.

In FIG. 3, $C_F$ represents the variable capacitance of the fast diode 12 in the reverse voltage direction and $C_P$ represents the parasitic capacitance which is connected to the diode drive voltage $E_D$ under the worst case conditions. $D_S$ represents the shorting effect of slow diode 14.

At the end of the set up time discussed supra, the diode drive voltage $E_D$ and the capacitor drive voltage $E_C$ will be faced to a large negative voltage, preferably in the range of between $-300$ to $-700$ VDC. When this occurs, the slow diode shorts the stylus voltage within a few volts of ground thus preventing the stylus from writing. To hold the stylus near ground potential, the charge in the slow diode 14 must be as large as the total charge coupled through $C_F$, $C_P$ and capacitor 16.

In the "stylus on" condition, which is defined as the switching device or transistor 20 not conducting, the negative voltage swing will couple through the capacitor 16 and drive the stylus negative causing writing to occur for the write time period.

It will be apparent to those skilled in the art that the diode drive voltage $E_D$ also acts as a voltage clamp which will prevent the ultimate drive voltage on the stylus from exceeding some predetermined maximum. For example, if $E_D = -400$ VDC and $E_C = -600$ VDC, the stylus voltage would be clamped at approximately $-400$ VDC.

This invention has been described with respect to negative voltages but would function equally well with positive voltages. Those skilled in the art will recognize that this would require reversal of the diode polarities and changing the type of switching transistors.

The switching circuit described supra can be repeated in parallel to define a switching assembly for an electrographic writing system.

The use of this switching system is not limited to electrographic recording devices but can be used with any device that requires momentary application of large voltages.

This invention has been described with reference to a preferred embodiment. Obvious modifications and alterations will occur to others upon reading and understanding of this specification. The invention is to include all such modifications and alterations insofar as they come within the scope of the appenbded claims or the equivalent thereof.

I claim:
1. A switching circuit comprising:
    a high stored charge diode having an anode and cathode; a capacitor, one side of said capacitor operatively connected to the anode of said high stored charge diode defining an output;
    means for selectively impressing a forward voltage across said high stored charge diode for causing current to flow in a forward direction;
    means for selectively impressing a reverse drive voltage to the other side of said capacitor, causing the voltage at said output to be shorted by said high stored charge diode when a forward voltage was previously impressed across said high stored charge diode and such that said reverse drive voltage will be coupled through said capacitor and the output not shorted by said high stored charged diode when no forward voltage was previously impressed across said high stored charged diode.
2. The switching circuit of claim 1 wherein said means for selectively impressing a forward voltage includes a transistor operatively connected to said high stored charge diode.
3. The switching circuit of claim 1 further comprising a low stored charge diode having an anode and cathode operatively connected between said high stored charge diode and said means for selectively impressing a forward voltage with said cathode of said low stored charge diode connected to the anode of said high stored charge diode, said means for selectively impressing a forward voltage switching contemporaneously to the same polarity as the reverse drive voltage when switching occurs, and if said reverse drive voltage exeeds some predetermined value, the contemporaneously switched voltage clamps said output voltage through said low stored charge diode.
4. The switching circuit of claim 3 wherein said low stored charge diode has a charge less than 5 nanocoulombs after set up.
5. The switching circuit of claim 3 wherein the high stored charge diode has a stored charge of at least 20 nanocoulombs more than the low stored charge diode after set up.
6. The switching circuit of claim 1 wherein the high stored charge diode has a charge of about 25-80 nanocoulombs after set up.
7. The switching circuit of claim 1 wherein the high stored charge diode has a stored charge of at least 20 nanocoulombs more than the low stored charge diode after set up.
8. An electrographic writing system comprising:
    an electrographic writing head including a plurality of styli operatively connected to a switching system;
    the switching system including at least one diode assembly, each diode assembly including a plurality of diode switching circuits controlling the voltage of the plurality of styli, each diode switching circuit including a high stored charge diode having an anode and a cathode, one side of a capacitor operatively connected to the anode of said high stored charge diode and to a stylus within said plurality of styli, means for selectively impressing a forward voltage across said high stored charge diode for charge set-up and means for selectively impressing a reverse drive voltage to the other end of said capacitor causing said reverse drive voltage to be coupled through said capacitor to said stylus when said high stored charge diode was not set up and causing the stylus voltage coupled through said capacitor to be shorted when said high stored charge diode was set up.

9. The electrographic writing system of claim 8 wherein said means for selectively impressing a forward voltage across said high stored charge diode includes a low stored charge diode in series therewith.

10. The electrographic writing system of claim 9 wherein each of the styli is operatively connected to a diode switching circuit.

11. The electrographic writing system of claim 8, wherein said means for selectively impressing a forward voltage across said high stored charge diode includes a switching device operatively connected to a plurality of diode assemblies.

12. The electrographic writing system of claim 11 wherein said switching device is a transistor.

* * * * *